(12) United States Patent
Beaman

(10) Patent No.: US 6,589,843 B1
(45) Date of Patent: *Jul. 8, 2003

(54) METHODS OF FORMING FLASH FIELD EFFECT TRANSISTOR GATES AND NON-FLASH FIELD EFFECT TRANSISTOR GATES

(75) Inventor: Kevin L. Beaman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/043,430

(22) Filed: Jan. 9, 2002

(51) Int. Cl.$^7$ .............................................. H01L 21/336
(52) U.S. Cl. ...................................... 438/261; 438/258
(58) Field of Search ................................ 438/261, 258

(56) References Cited

U.S. PATENT DOCUMENTS

| | | | |
|---|---|---|---|
| 4,471,373 A | * 9/1984 | Shimizu et al. | 257/315 |
| 4,808,261 A | 2/1989 | Ghidini et al. | 156/653 |
| 5,428,572 A | * 6/1995 | Mori | 365/184 |
| 5,434,109 A | 7/1995 | Geissler et al. | 437/329 |
| 5,981,404 A | 11/1999 | Sheng et al. | 438/791 |
| 6,004,847 A | * 12/1999 | Clementi et al. | 438/201 |
| 6,162,684 A | * 12/2000 | Chang et al. | 438/261 |

OTHER PUBLICATIONS

Wilk, G.D., et al., "Electrical Characteristics of High–Quality Sub–27–A Oxides Grown by Ultraviolet Ozone Exposure at Low Temperature", Mar. 1999, IEEE Electron Device Letters, vol. 20, No. 3, pp. 132–134.*

U.S. patent application Ser. No. 09/653,281, Beaman et al., filed Aug. 31, 2000.

Hoff et al., *Atomic oxygen and the thermal oxidation of silicon*, 52 Appl. Phys. Lett., No. 15, pp. 1265–1265 (Apr. 11, 1988).

Luo et al., *Effect of $H_2$ Content on Reliability of Ultrathin In–Sutu Steam Generated (ISSG) $SiO_2$*, 21 IEEE Electron Device Letters, No. 9, pp. 430–432 (Sep. 2000).

Ruzyllo et al., *Evaluation of Thin Oxides Grown by the Atomic Oxygen Afterglow Method*, 16 Journal of Electronic Materials, No. 5, pp. 373–378 (1987).

* cited by examiner

Primary Examiner—Wael Fahmy
Assistant Examiner—Howard Weiss
(74) Attorney, Agent, or Firm—Wells St. John P.S.

(57) ABSTRACT

Methods of forming FLASH field effect transistor gates and a non-FLASH field effect transistor gates are described. In one implementation, a substrate comprising first and second semiconductive material portions is provided. A FLASH transistor gate is partially formed to include at least a first gate dielectric material received over the first semiconductive material portion, a floating gate material overlying the first gate dielectric material, and a second gate dielectric material received over the floating gate material. The second gate dielectric material comprises silicon nitride. In a common oxidizing step, the silicon nitride of the second gate dielectric material and the second semiconductive material portion are oxidized effective to form both a) a gate oxide layer of a non-FLASH transistor gate overlying the second semiconductive material portion, and b) silicon dioxide as part of the second gate dielectric material of the FLASH transistor gate. Additional implementations are contemplated.

13 Claims, 3 Drawing Sheets

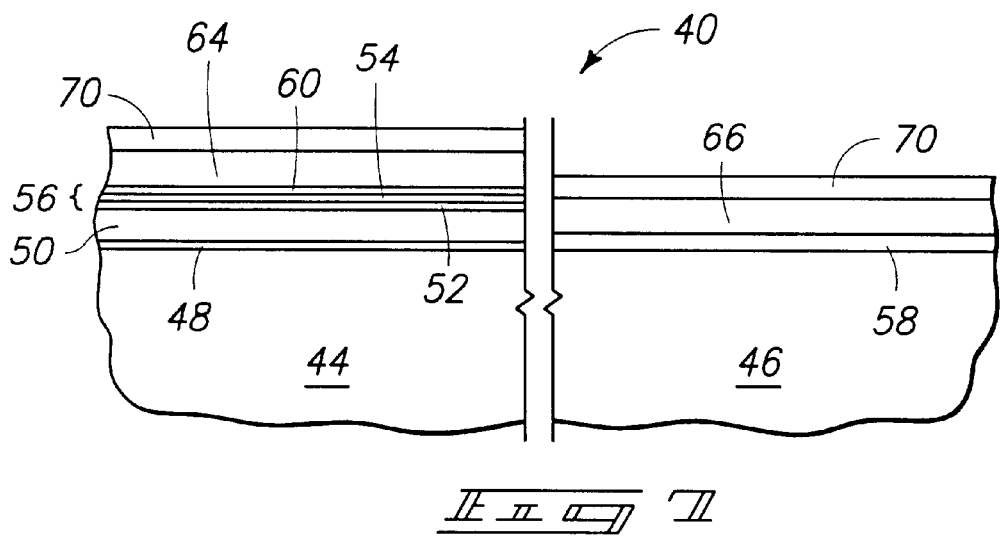
_Fig. 7_
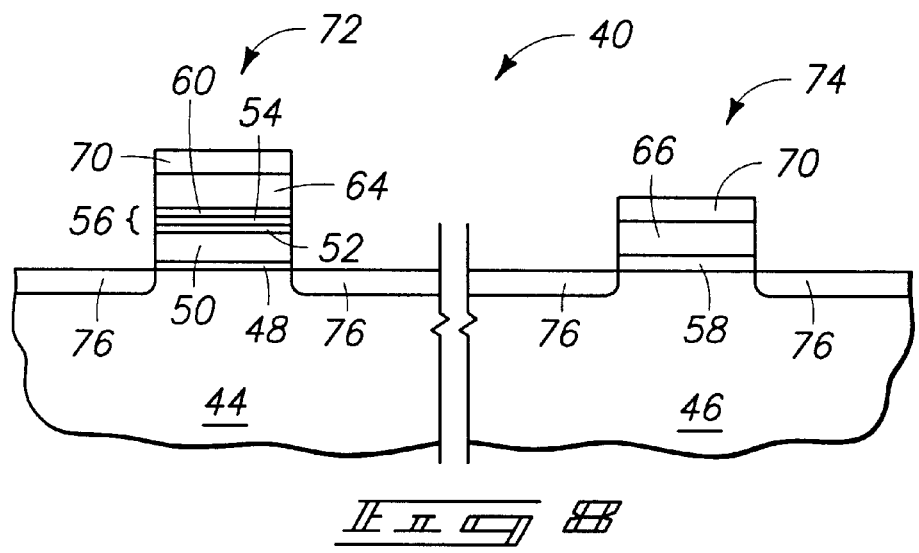
_Fig. 8_

METHODS OF FORMING FLASH FIELD EFFECT TRANSISTOR GATES AND NON-FLASH FIELD EFFECT TRANSISTOR GATES

TECHNICAL FIELD

This invention relates to methods of forming FLASH field effect transistor gates and non-FLASH field effect transistor gates.

BACKGROUND OF THE INVENTION

In semiconductor wafer fabrication, certain integrated circuit designs form both FLASH field effect transistors and non-FLASH field effect transistors on the same semiconductor substrate. One particular aspect of doing so, and problems associated therewith, is described with reference to FIGS. 1–2.

FIG. 1 depicts a semiconductor wafer fragment 10 at one processing step. Wafer fragment 10 is comprised of a bulk monocrystalline silicon substrate 11 having first and second semiconductive material portions 12 and 13. In the context of this document, the term "semiconductive substrate" or "semiconductor substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other material). The term "substrate" refers to any supporting structure, including, but not limited to, the semiconductive substrates described above. Further, in the context of this document, the term "layer" refers to both the singular and plural unless otherwise indicated.

A FLASH field effect transistor gate is shown as being partially formed over the first semiconductive material portion 12 of substrate 11. Such includes a first gate dielectric material 21 (i.e. silicon dioxide), a floating gate material 22 (i.e. conductively doped polysilicon) received over first gate dielectric material 21, and a partially formed second gate dielectric material 30 received over floating gate material 22. Partially formed second gate dielectric material 30 includes a first silicon dioxide layer 31 and a silicon nitride layer 32 thereover.

Referring to FIG. 2, a second silicon dioxide layer 33 is shown to have been formed over silicon nitride layer 32. Formation of second silicon dioxide layer 33 typically completes the second gate dielectric material 30, which now comprises a three layer structure which includes a first silicon dioxide layer 31, a middle silicon nitride layer 32, and a outer or second silicon dioxide layer 33. This second gate dielectric material layer 30 is commonly referred to as an "oxide-nitride-oxide layer", or an "ONO layer".

Although it is possible for the second silicon dioxide layer 33 to be deposited, under typical prior art methods it is generally formed by oxidation of silicon nitride layer 32. The prior art processing illustrated in FIG. 2 typically forms second silicon dioxide layer 33 by a thermal oxidation method which includes a long, hot, wet oxidation step. The goal of this thermal oxidation was typically to form a 15–30 Å thick silicon dioxide layer 33 on silicon nitride layer 32. By way of illustration only, example conditions to form this 15–30 Å thick silicon dioxide layer 33 included exposing semiconductor wafer fragment 10 to a temperature of about 850° C. to about 1000° C., and ambient pressure in the presence of steam for about 90 to 240 minutes.

Unfortunately, this thermal oxidation would also generally oxidize any exposed silicon and result in the formation of a 2000–3000 Å thick silicon dioxide layer over any such exposed silicon. For example, a 15–30 Å thick silicon dioxide layer 33 is shown to have formed on silicon nitride layer 32, while a considerably thicker silicon dioxide layer 34 is shown to have formed over the exposed silicon of second semiconductive material portion 13.

This consumption of silicon and thick oxide deposition is generally undesirable, especially when one wishes to subsequently form another integrated circuit component over silicon substrate 11, such as forming a non-FLASH field effect transistor over the second semiconductive material portion 13. Therefore, under prior art processing methods, other areas of silicon substrate 11, such as second semiconductive material portion 13, might be masked to avoid such consumption of silicon and thick oxide deposition thereover. After the thermal oxidation has been completed, the mask would be removed and a dedicated oxidation conducted to form any desired peripheral gate oxide layers over silicon substrate 11.

The invention was principally motivated by a desire to address the above-identified issue. However, the invention is in no way so limited, and is only limited by the accompanying claims as literally worded and appropriately interpreted in accordance with the Doctrine of Equivalents.

SUMMARY OF THE INVENTION

Methods of forming FLASH field effect transistor gates and a non-FLASH field effect transistor gates are described. In one implementation, a substrate comprising first and second semiconductive material portions is provided. A FLASH transistor gate is partially formed to include at least a first gate dielectric material received over the first semiconductive material portion, a floating gate material overlying the first gate dielectric material, and a second gate dielectric material received over the floating gate material. The second gate dielectric material comprises silicon nitride. In a common oxidizing step, the silicon nitride of the second gate dielectric material and the second semiconductive material portion are oxidized effective to form both a) a gate oxide layer of a non-FLASH transistor gate overlying the second semiconductive material portion, and b) silicon dioxide as part of the second gate dielectric material of the FLASH transistor gate. In one implementation, in a common oxidizing step, the silicon nitride of the second gate dielectric material and the second semiconductive material portion are exposed to atomic oxygen under conditions effective to form both a) a gate oxide layer of a non-FLASH transistor gate overlying the second semiconductive material portion, and b) silicon dioxide as part of the second gate dielectric material of the FLASH transistor gate. Additional implementations are contemplated.

BRIEF DESCRIPTION OF THE DRAWINGS

Preferred embodiments of the invention are described below with reference to the following accompanying drawings.

FIG. 7 is a view of the FIG. 6 wafer fragment at a processing step subsequent to that shown by FIG. 6.

FIG. 8 is a view of the FIG. 7 wafer fragment at a processing step subsequent to that shown by FIG. 7.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
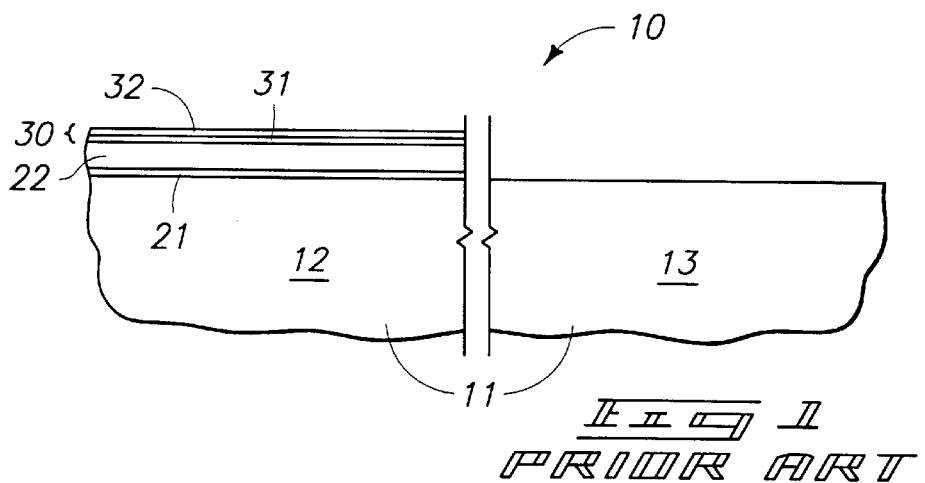
FIG. 1 is a diagrammatic sectional view of a prior art semiconductor wafer fragment at one prior art processing step.
Figure 2:
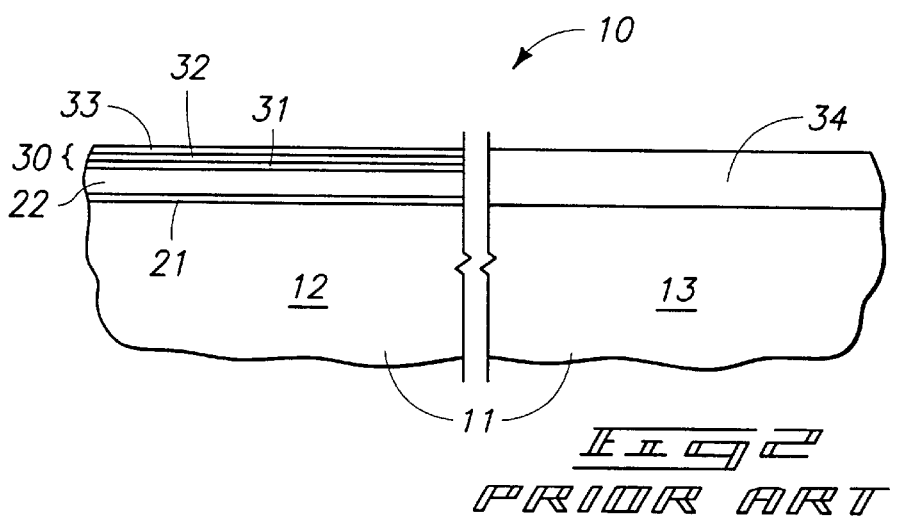
FIG. 2 is a view of the FIG. 1 prior art wafer fragment at a processing step subsequent to that shown by FIG. 1.
Figure 3:
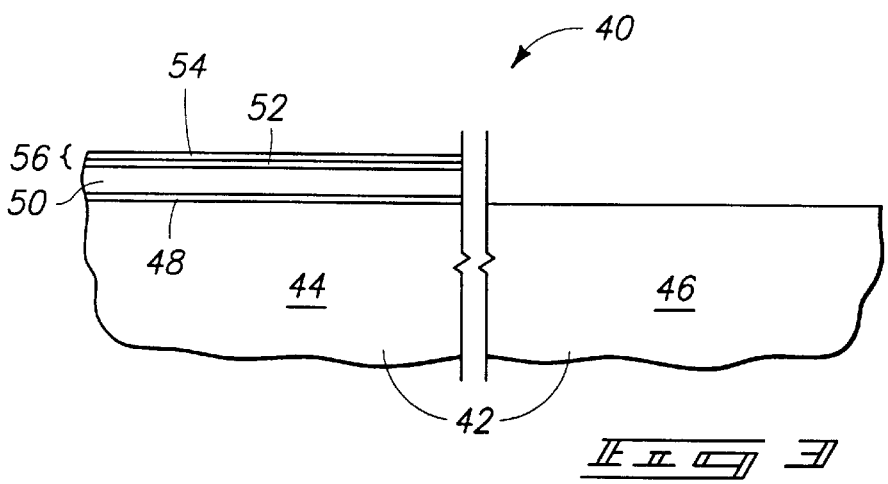
FIG. 3 is a diagrammatic sectional view of a semiconductor wafer fragment at one processing step in accordance with one aspect of the invention.

Preferred embodiments of methods of forming a FLASH field effect transistor gate and non-FLASH field effect transistor gate are described with reference to FIGS. 3–8. FIG. 3 depicts a semiconductor wafer fragment 40, for example comprising a bulk monocrystalline silicon substrate region 42. Substrate 42 can be considered as comprising first and second semiconductive material portions 44 and 46, respectively. In the depicted described example, a FLASH field effect transistor gate is being formed relative to portion 44, and a non-FLASH field effect transistor gate is being formed relative to portion 46. Portion 44 has been processed to include a first gate dielectric material 48 received thereover. A floating gate material 50 is formed to overly first gate dielectric material 48. A second gate dielectric material overlies floating gate material 50. In the depicted embodiment, such includes a first silicon dioxide comprising layer 52 and a silicon nitride comprising layer 54 thereover. Collectively, layers 52 and 54 can be considered as a second gate dielectric material 56, which at least comprises silicon nitride. First silicon dioxide comprising layer 52 is typically formed to a thickness of about 30–60 Å, while silicon nitride comprising layer 54 is formed to a thickness of about 40–70 Å. Such shows but one exemplary embodiment of partially forming a FLASH transistor gate which includes at least a first gate dielectric material which is received over a first semiconductor material portion, a floating gate material which overlies the first gate dielectric material, and a second gate dielectric material which is received over the floating gate material, with the second gate dielectric material comprising silicon nitride.

Figure 4:
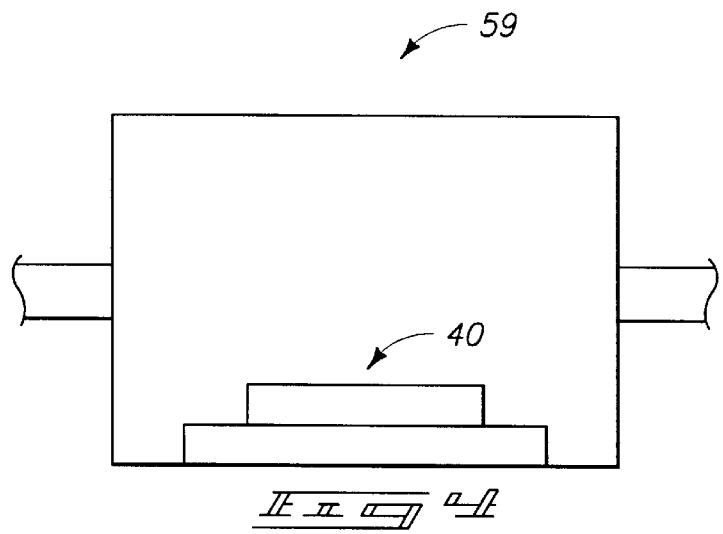
FIG. 4 is a view of the FIG. 3 wafer fragment within a processing chamber.
Figure 5:
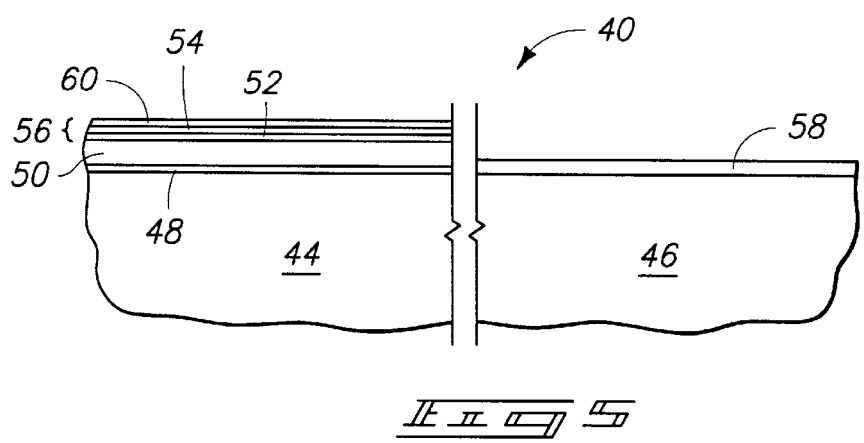
FIG. 5 is a view of the FIG. 4 wafer fragment at a processing step subsequent to that shown by FIG. 4.

Referring to FIGS. 4 and 5, substrate 40 of FIG. 3 in one preferred embodiment has been positioned within a processing chamber 59. Silicon nitride of second gate dielectric material 56 and second semiconductive material portion 46 are oxidized in a common-oxidizing step. Such oxidizing is effective to form both a gate oxide layer 58 of what will be a non-FLASH transistor gate overlying second semiconductive material portion 46, and silicon dioxide 60 as part of second gate dielectric material 56 of what will be a FLASH transistor gate. Any suitable oxidizing conditions are contemplated. Preferred oxidizing conditions include a temperature of about 850 degrees C. to about 1100 degrees C. Further, chamber 59 might constitute a conventional furnace, a rapid thermal processor, or any other existing or yet-to-be developed chamber suitable for oxidizing the substrate.

One preferred method includes exposing the silicon nitride of second gate dielectric material 56 and the second semiconductive material portion 46 to atomic oxygen. Example techniques for doing so are disclosed in our co-pending U.S. patent application Ser. No. 09/653,281, filed on Aug. 31, 2000, having inventors Kevin L. Beaman et. al., entitled Use of Atomic Oxidation for Fabrication of Oxide-Nitride-Oxide Stack for Flash Memory Devices, which is hereby incorporated by reference. The atomic oxygen might be supplied by an ozone source, a microwave source, by photo-excitation, by in situ steam generation, or other method. A more specific example includes injecting hydrogen and oxygen gas into the processing chamber effective to generate atomic oxygen proximate the substrate. One example process would include heating the substrate to a temperature of about 850 degrees C. to about 1100 degrees C. prior to injecting the hydrogen and oxygen. A preferred pressure range within the reactor during processing, by way of example only, is from 5 to 10 Torr. Such processing is also preferably effective to generate steam along with the atomic oxygen proximate the substrate. A more specific example includes injecting hydrogen and oxygen gas into the processing chamber effective to form a mixture of gasses comprising about 0.5% to about 33% hydrogen gas by volume. Regardless, the hydrogen gas within the chamber will have partial pressure which can be varied to control a rate at which the silicon nitride will be oxidized, with increasing of the partial pressure of the hydrogen gas tending to increase the rate at which the silicon nitride is oxidized. In one preferred embodiment, second semiconductive material portion 46 will be oxidized at one rate, and silicon nitride of second gate dielectric material 56 will be oxidized at another rate which is from about 10% to about 70% of the first rate, whereby the respective thicknesses of the oxide comprising layer 60 and oxide comprising layer 58 can be selectively different.

Figure 6:
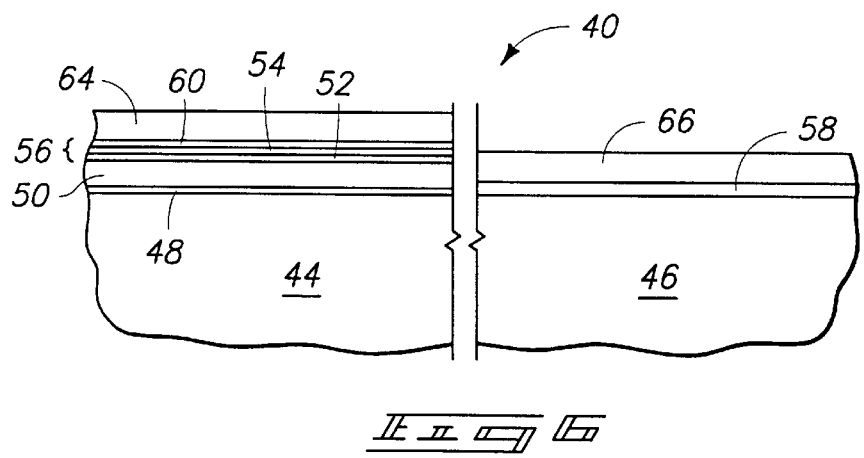
FIG. 6 is a view of the FIG. 5 wafer fragment at a processing step subsequent to that shown by FIG. 5.

Referring to FIG. 6, a first gate material 64 is formed over second gate dielectric material 56 and a second gate material 66 is formed over gate oxide layer 58 over second semiconductive material portion 46 in the fabrication of a non-FLASH transistor gate. Such materials might be the same or different materials, might be of the same or different thicknesses, and might be formed in the same or different processing steps. Preferably, such are formed in the same step, with conductively doped polysilicon being an example material.

Referring to FIG. 7, an insulative capping layer 70 has been formed over the respective first and second gate materials. Exemplary preferred materials include silicon dioxide and silicon nitride.

Referring to FIG. 8, the illustrated layers have been fabricated to form a FLASH field effect transistor gate 72 and a non-FLASH field effect transistor gate 74. Source and drain regions 76 are also shown as having been provided within semiconductive material portions 44 and 46.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a FLASH field effect transistor gate and a non-FLASH field effect transistor gate, comprising:

providing a substrate comprising first and second semiconductive material portions;

partially forming a FLASH transistor gate to include at least a first gate dielectric material received over the first semiconductive material portion, a floating gate material overlying the first gate dielectric material, and a second gate dielectric material received over the floating gate material; the second gate dielectric material comprising outwardly exposed silicon nitride; and in a common oxidizing step and while the second semiconductive material portion is outwardly exposed, exposing the outwardly exposed silicon nitride of the second gate dielectric material and the outwardly exposed second semiconductive material portion to atomic oxygen under conditions effective to form both a) a gate oxide layer of a non-FLASH transistor gate on semiconductive material of the second semiconductive material portion, and b) silicon dioxide on the silicon nitride as part of the second gate dielectric material of the FLASH transistor gate, the silicon dioxide of the FLASH transistor gate being formed by oxidation of the outwardly exposed silicon nitride and being formed to a thickness which is less than that of the gate oxide layer of the non-FLASH transistor gate.

2. The method of claim 1, wherein after the common oxidizing step, forming a first gate material over the second gate dielectric material and forming a second gate material over the gate oxide layer of the non-FLASH transistor gate.

3. The method of claim 1, wherein the atomic oxygen is supplied by an ozone source.

4. The method of claim 1, wherein the atomic oxygen is supplied by a microwave source.

5. The method of claim 1, wherein the atomic oxygen is supplied by photo-excitation.

6. The method of claim 1, wherein the atomic oxygen is supplied by in situ steam generation.

7. The method of claim 1, wherein the common oxidizing step comprises:

providing the substrate with the partially formed FLASH transistor gate within a processing chamber;

after providing the substrate within the processing chamber and prior to injecting any hydrogen and oxygen to the processing chamber, heating the substrate to a temperature of about 850 degrees C. to about 1100 degrees C.; and after heating the substrate to a temperature of about 850 degrees C. to about 1100 degrees C., injecting hydrogen and oxygen gas into the processing chamber to generate the atomic oxygen proximate the substrate.

8. The method of claim 1, wherein the gate oxide layer of the non-FLASH transistor gate overlying the second semiconductive material portion is formed to a first thickness, and wherein the silicon dioxide formed as part of the second gate dielectric material of the FLASH transistor gate is formed to a second thickness, and wherein the second thickness is about 10% to about 70% of the first thickness.

9. A method of forming a FLASH field effect transistor gate and a non-FLASH field effect transistor gate, comprising:

providing a substrate comprising first and second semiconductive material portions;

partially forming a FLASH transistor gate to include at least a first gate dielectric material received over the first semiconductive material portion, a floating gate material overlying the first gate dielectric material, and a second gate dielectric material received over the floating gate material; the second gate dielectric material comprising a first silicon dioxide comprising layer and an outwardly exposed silicon nitride comprising layer over the first silicon dioxide comprising layer; and in a common oxidizing step and while the second semiconductive material portion is outwardly exposed, exposing the outwardly exposed silicon nitride of the second gate dielectric material and the outwardly exposed second semiconductive material portion to atomic oxygen under conditions effective to form both a) a gate oxide layer of a non-FLASH transistor gate on semiconductive material of the second semiconductive material portion, and b) a second silicon dioxide comprising layer on the silicon nitride comprising layer as part of the second gate dielectric material of the FLASH transistor gate, the second silicon dioxide of the FLASH transistor gate being formed by oxidation of the outwardly exposed silicon nitride and being formed to a thickness which is less than that of the gate oxide layer of the non-FLASH transistor gate.

10. The method of claim 9, wherein after the common oxidizing step, forming a first gate material over the second gate dielectric material and forming a second gate material over the gate oxide layer of the non-FLASH transistor gate.

11. The method of claim 9, wherein the common oxidizing step comprises:

providing the substrate with the partially formed FLASH transistor gate within a processing chamber; and injecting hydrogen and oxygen gas into the processing chamber to generate the atomic oxygen proximate the substrate.

12. The method of claim 9, wherein the second semiconductive material portion is oxidized at a first rate, and wherein the silicon nitride of the second gate dielectric material is oxidized at a second rate which is about 10% to about 70% of the first rate.

13. The method of claim 9, wherein the common oxidizing step comprises:

providing the substrate with the partially formed FLASH transistor gate within a processing chamber;

after providing the substrate within the processing chamber and prior to injecting any hydrogen and oxygen to the processing chamber, heating the substrate to a temperature of about 850 degrees C. to about 1100 degrees C.; and after heating the substrate to a temperature of about 850 degrees C. to about 1100 degrees C., injecting hydrogen and oxygen gas into the processing chamber to generate the atomic oxygen proximate the substrate.

* * * * *

UNITED STATES PATENT AND TRADEMARK OFFICE
CERTIFICATE OF CORRECTION

PATENT NO. : 6,589,843 B1 Page 1 of 1
DATED : July 8, 2003
INVENTOR(S) : Kevin L. Beaman It is certified that error appears in the above-identified patent and that said Letters Patent is hereby corrected as shown below:

Column 3,
Line 31, replace "A floating gate material 50 is formed to overly first gate" with -- A floating gate material 50 is formed to overlie first gate --
Line 53, replace "are oxidized in a common-oxidizing step. Such oxidizing is" with -- are oxidized in a common oxidizing step. Such oxidizing is --

Signed and Sealed this

Twenty-eighth Day of October, 2003

JAMES E. ROGAN
*Director of the United States Patent and Trademark Office*